(12) United States Patent
Chan et al.

(10) Patent No.: US 9,209,148 B2
(45) Date of Patent: *Dec. 8, 2015

(54) SEMICONDUCTOR PACKAGE (71) Applicant: MediaTek Inc, Hsin-Chu (TW)

(72) Inventors: Kuei-Ti Chan, Hsinchu (TW);
Tzu-Hung Lin, Zhubei (TW);
Ching-Liou Huang, Qionglin Township, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/663,755

(22) Filed: Mar. 20, 2015

(65) Prior Publication Data
US 2015/0194403 A1 Jul. 9, 2015

Related U.S. Application Data (63) Continuation of application No. 13/109,740, filed on May 17, 2011, now Pat. No. 8,987,897.

(60) Provisional application No. 61/416,924, filed on Nov. 24, 2010.

(51) Int. Cl.
*H01L 23/48* (2006.01)
*H01L 23/00* (2006.01)
(Continued)

(52) U.S. Cl.
CPC ............ *H01L 24/13* (2013.01); *H01L 23/3171* (2013.01); *H01L 23/528* (2013.01); *H01L 23/5227* (2013.01); *H01L 23/645* (2013.01); *H01L 23/66* (2013.01); *H01L 24/03* (2013.01); *H01L 24/05* (2013.01); *H01L 24/11* (2013.01); *H01Q 23/00* (2013.01); *H01L 23/525* (2013.01); *H01L 2223/6677* (2013.01); *H01L 2224/0345* (2013.01); *H01L 2224/0346* (2013.01); *H01L 2224/0347* (2013.01); *H01L 2224/03462* (2013.01); *H01L 2224/0401* (2013.01);
(Continued)

(58) Field of Classification Search
CPC .... H01L 23/488; H01L 24/13; H01L 23/5227
USPC ........................................................ 257/737
See application file for complete search history.

(56) References Cited

U.S. PATENT DOCUMENTS 8,987,897 B2 * 3/2015 Chan et al. ................... 257/737
2001/0015495 A1 8/2001 Brofman et al.
(Continued)

FOREIGN PATENT DOCUMENTS

JP 2004-363204 12/2004

OTHER PUBLICATIONS

English language translation of abstract of JP 2004-363204 (published Dec. 24, 2004).

*Primary Examiner* — Bradley K Smith
(74) *Attorney, Agent, or Firm* — McClure, Qualey & Rodack, LLP (57) ABSTRACT

A semiconductor package includes a substrate, a first passivation layer disposed on the substrate, and an under bump metallurgy layer disposed on the first passivation layer. A passive device is disposed on the under bump metallurgy layer, and an additional under bump metallurgy layer is disposed on the first passivation layer, isolated from the under bump metallurgy layer. A conductive pillar is disposed on the additional under bump metallurgy layer, wherein the conductive pillar and the passive device are at the same level.

17 Claims, 10 Drawing Sheets

(51) Int. Cl.
    *H01L 23/522*   (2006.01)
    *H01Q 23/00*    (2006.01)
    *H01L 23/31*    (2006.01)
    *H01L 23/528*   (2006.01)
    *H01L 23/64*    (2006.01)
    *H01L 23/66*    (2006.01)
    *H01L 23/525*   (2006.01)

(52) U.S. Cl.
    CPC .............. *H01L2224/05027* (2013.01); *H01L 2224/05082* (2013.01); *H01L 2224/05147* (2013.01); *H01L 2224/05166* (2013.01); *H01L 2224/05572* (2013.01); *H01L 2224/05655* (2013.01); *H01L 2224/1147* (2013.01); *H01L 2224/11462* (2013.01); *H01L 2224/11912* (2013.01); *H01L 2224/131* (2013.01); *H01L 2224/13023* (2013.01); *H01L 2224/13083* (2013.01); *H01L 2224/13147* (2013.01); *H01L 2224/13155* (2013.01); *H01L 2224/73204* (2013.01); *H01L 2924/00014* (2013.01); *H01L 2924/014* (2013.01); *H01L 2924/01029* (2013.01); *H01L 2924/01033* (2013.01); *H01L 2924/01074* (2013.01); *H01L 2924/01075* (2013.01); *H01L 2924/12* (2013.01); *H01L 2924/1206* (2013.01)

(56) References Cited

U.S. PATENT DOCUMENTS

| | | |
|---|---|---|
| 2002/0101329 A1 | 8/2002 | Marcoux et al. |
| 2007/0138572 A1 | 6/2007 | Lam |
| 2009/0057895 A1 | 3/2009 | Lin et al. |
| 2009/0184420 A1 | 7/2009 | Choi et al. |
| 2012/0032322 A1 | 2/2012 | Lin et al. |

\* cited by examiner

SEMICONDUCTOR PACKAGE

CROSS REFERENCE TO RELATED APPLICATIONS

This application is a continuation of U.S. patent application Ser. No. 13/109,740, filed on May 17, 2011, now U.S. Pat. No. 8,987,897, which claims the benefit of U.S. Provisional Application No. 61/416,924, filed on Nov. 24, 2010, the entireties of which are incorporated by reference herein.

BACKGROUND OF THE INVENTION

1. Field of the Invention

The present invention relates to a semiconductor package, and in particular, to a passive device of semiconductor package.

2. Description of the Related Art

For the conventional flip chip package, one criterion of inductors is low resistance, so that a high quality factor (Q factor) can be achieved. The quality factor (Q factor) of an inductor is the ratio of its inductive reactance to its resistance at a given frequency, and is a measure of its efficiency. The higher the Q factor of the inductor, the closer it approaches the behavior of an ideal, lossless, inductor.

The conventional flip chip package fabrication process usually uses additional metal layers of an interconnection structure of a chip to improve the quality factor (Q factor). However, the additional metal layers will increase fabrication costs and negatively affect fabrication throughput.

Thus, a novel inductor with an increased Q factor is desirable.

BRIEF SUMMARY OF INVENTION

A semiconductor package is provided. An exemplary embodiment of a semiconductor package includes a substrate. A first passivation layer is disposed on the substrate. An under bump metallurgy layer is disposed on the first passivation layer. A passive device is disposed on the under bump metallurgy layer.

Another exemplary embodiment of a semiconductor package includes an under bump metallurgy layer, disposed on a substrate. A passive device is disposed on the under bump metallurgy layer. A solder is disposed on the passive device.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

FIGS. 1~9 are cross section views for fabricating one exemplary embodiment of a semiconductor package 500 of the invention. One exemplary embodiment of a semiconductor package 500 is a flip chip package. One exemplary embodiment of a semiconductor package 500 comprises a passive device integrated with a conductive pillar, which is disposed between a metal pad and a conductive bump, of a bump structure, so that the passive device may have a thickness much thicker than a conventional passive device disposed in the interconnection structure without additional metal layers. If the passive device is an inductor, the passive device has reduced resistance and a high quality factor (Q factor).

Figure 1:
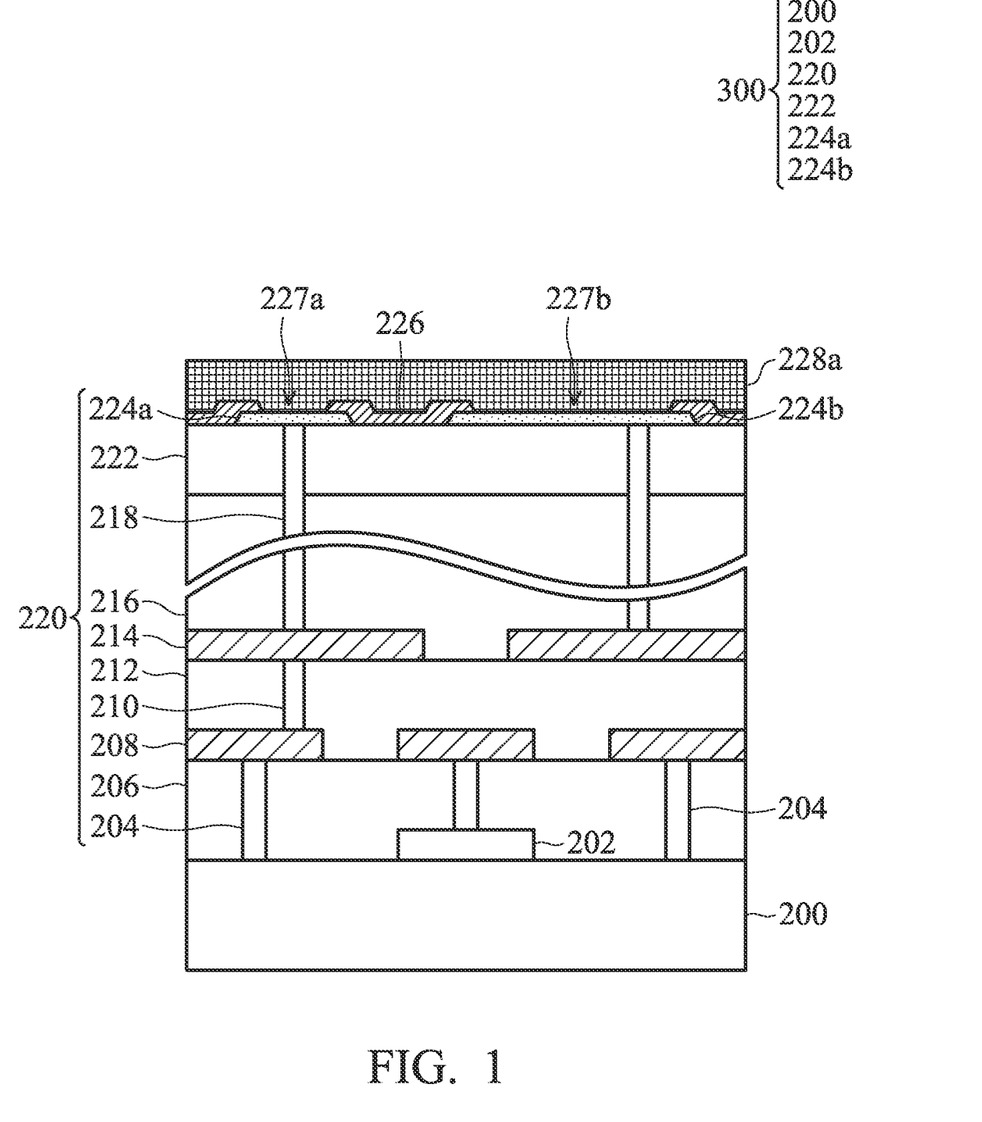
FIGS. 1~9 are cross section views for fabricating one exemplary embodiment of a semiconductor package of the invention.

Referring to FIG. 1, firstly, a semiconductor chip 300 is provided. In one embodiment, the semiconductor chip 300 comprises a substrate 200 with a semiconductor device 202 disposed thereon. An interconnection structure 220 is formed on the substrate 200 and the semiconductor device 202. In one embodiment, the interconnection structure 220 may provide electrical transmitting paths for the semiconductor device 202. In one embodiment, the interconnection structure 220 may comprise a plurality of metal layers, a plurality of dielectric layers alternatively laminated with the metal layers and a plurality of vias formed through the dielectric layers on the substrate 200. For example, the metal layers of the interconnection structure 220 may comprise the metal layers 208, 214 and metal pads 224a and 224b. Also, the metal pads 224a and 224b belong to the uppermost metal layer of the metal layers of the interconnection structure 220. In this embodiment, the metal pad 224a is used to transmit input/output (I/O), ground or power signals of the semiconductor chip 300, and the metal pad 224b is used to transmit power signals to a subsequent passive device formed thereon. For example, the dielectric layers of the interconnection structure 220 may comprise the dielectric layers 206, 212, 216 and the passivation layer 222. Also, the passivation layer 222 belongs to the uppermost dielectric layer of the dielectric layers of the interconnection structure 220.

Next, still referring to FIG. 1, a bump process is performed on the semiconductor chip 300. A passivation layer 226 is conformably formed covering the metal pads 224a and 224b by a deposition method. In one embodiment, the passivation layers 222 and 226 may comprise oxide, nitride, or oxynitride. Next, the passivation layer 226 is patterned to respectively formed openings 227a and 227b on the metal pads 224a and 224b, so that a portion of the metal pads 224a and 224b are respectively exposed from the openings 227a and 227b.

Next, still referring to FIG. 1, a passivation layer 228 is entirely formed by a coating method. In one embodiment, the passivation layer 228 may comprise polyimide for providing reliable insulation when the semiconductor chip 300 is subjected to various types of environmental stresses.

Figure 2:
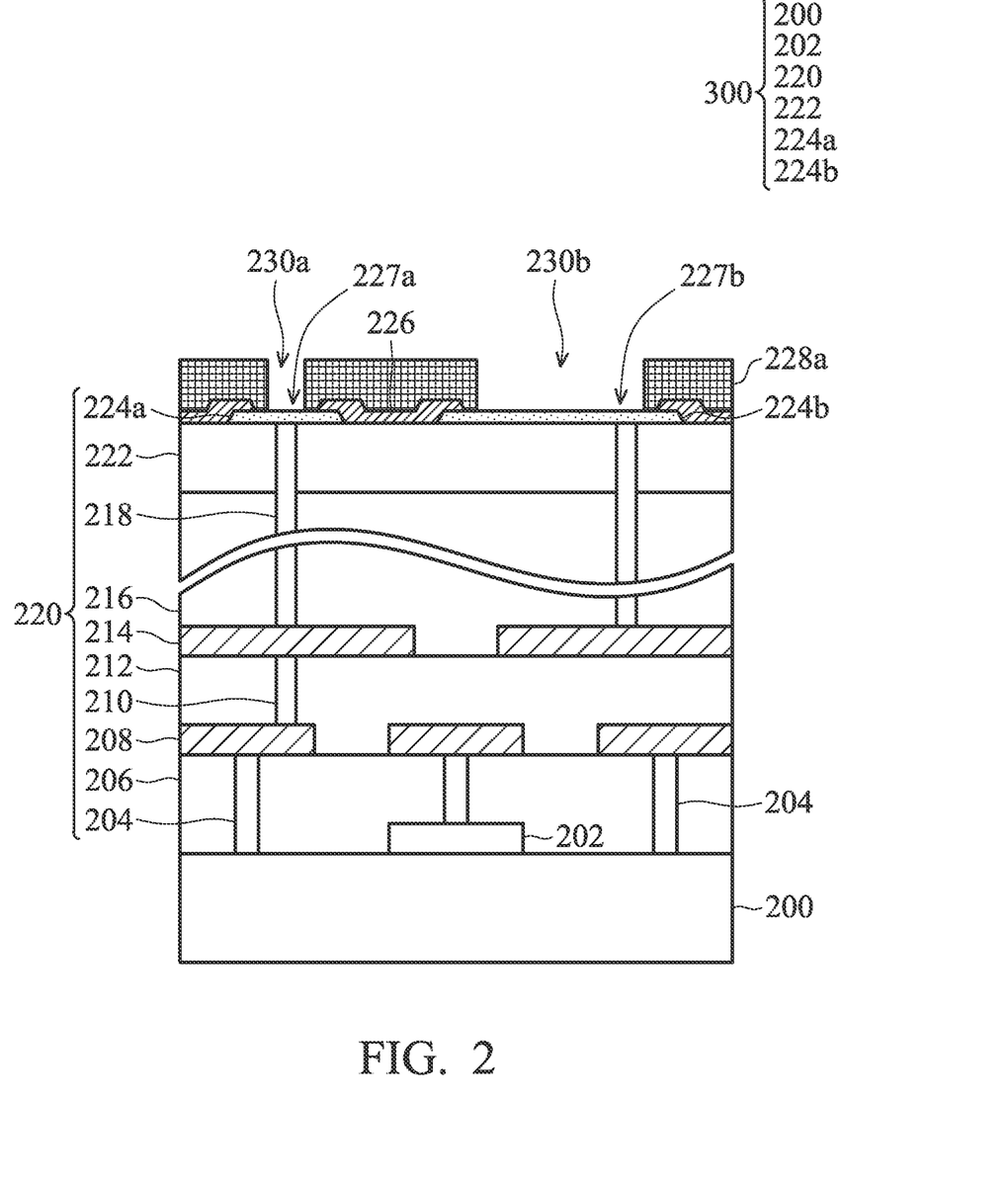

Next, referring to FIG. 2, portions of the passivation layer 228 are removed by a patterning process comprising a photolithography and a develop process to form openings 230a and 230b over the openings 227a and 227b, respectively.

Therefore, a portion of the metal pads 224a and 224b are respectively exposed from the openings 230a and 230b.

Figure 3:
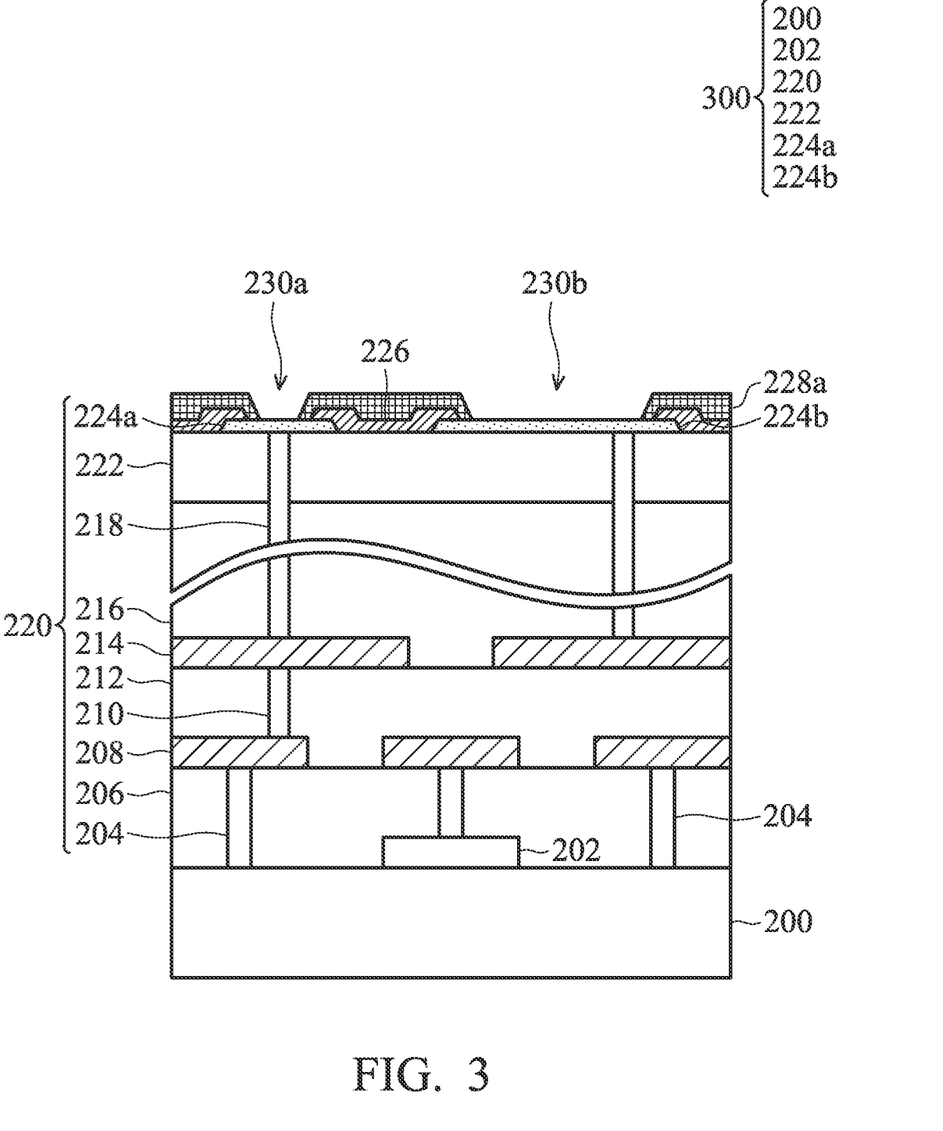

Next, referring to FIG. 3, the passivation layer 228 as shown in FIG. 2 is subjected a curing process to solidify the passivation layer 228. After the curing process, the level of the passivation layer 228 may drop to form a cured passivation layer 228a as a result of shrinkage of the passivation layer.

Figure 4:
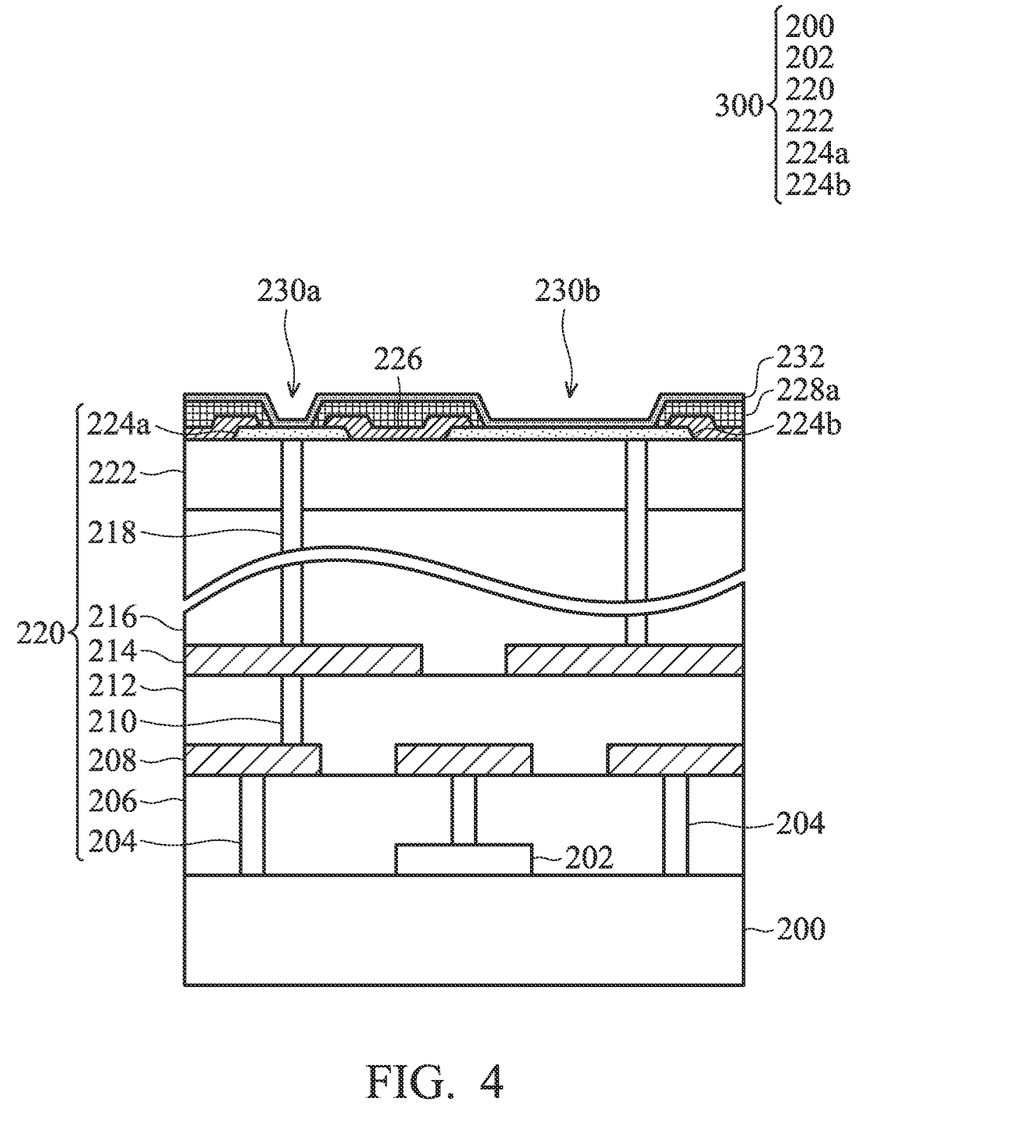
Figure 5:
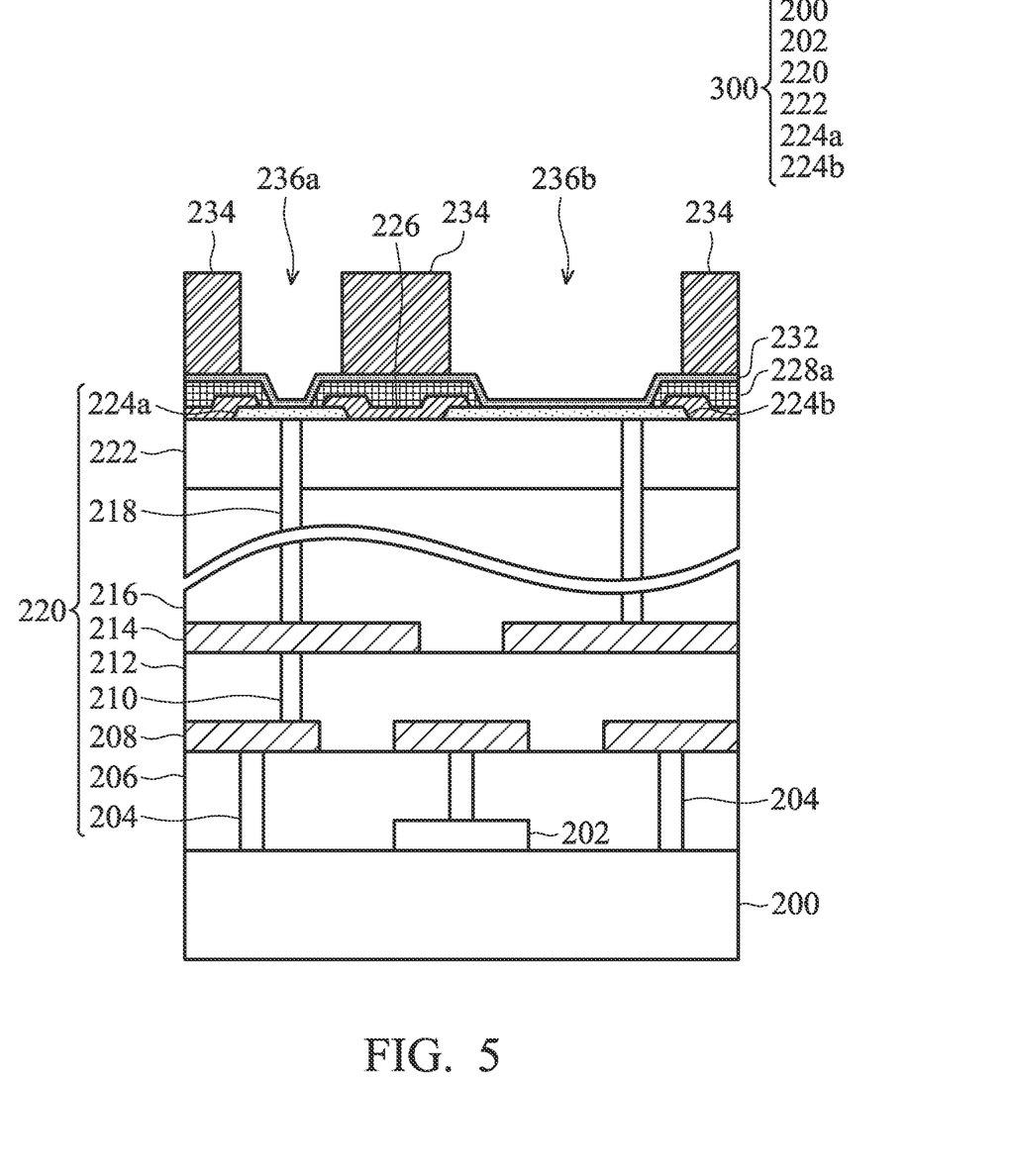

Next, referring to FIG. 4, an under bump metallurgy (UBM) layer 232 is formed on the cured passivation layer 228a by a deposition method such as a sputtering or plating method. Meanwhile, the UBM layer 232 lines a sidewall and a bottom surface of the openings 230a and 230b. Also, the UBM layer 232 extends over a top surface of the cured passivation layer 228a. In one embodiment, the UBM layer 232 is composed of a Ti layer and a Cu layer on the Ti layer.

FIGS. 5-8 show formation of a passive device and a conductive pillar on the UBM layer 232. Next, referring to FIG. 5, a dry film photoresist 234 is entirely laminated on the UBM layer 232. Alternatively, a liquid photoresist can be used to replace the dry film photoresist 234. Next, the dry film photoresist 234 is patterned by a photolithography process comprising an exposure step and a development step to form openings 236a and 236b respectively over the metal pads 224a and 224b, so that formation positions of the subsequent passive device and the conductive pillar are defined. In one embodiment, the dry film photoresist 234 may have a thickness of between about 20 μm and 40 μm.

Figure 6:
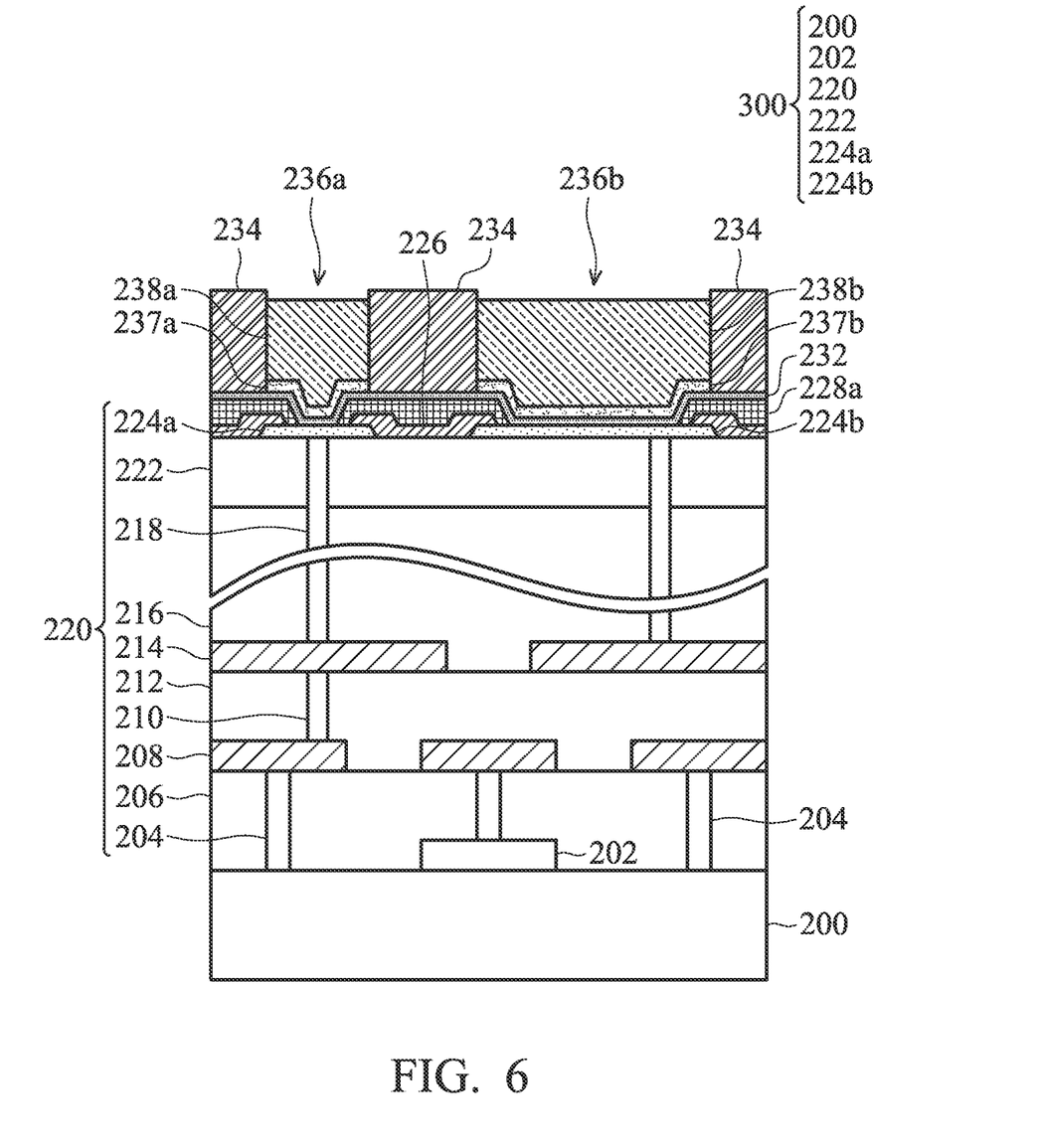

Next, referring to FIG. 6, conductive buffer layers 237a and 237b are respectively formed on bottom surfaces of the openings 234a and 234b by an electroplating method. In one embodiment, the conductive buffer layers 237a and 237b may serve as a seed layer, an adhesion layer and a barrier layer for a conductive pillar or a passive device formed thereon. In one embodiment, the conductive buffer layers 237a and 237b may comprise Ni. Then, the conductive pillar 238a and the passive device 238b are respectively formed on the conductive buffer layers 237a and 237b, filling the openings 236a and 236b. In one embodiment, the conductive pillar 238a is used as a solder joint for a subsequent conductive bump, which is used to transmit input/output (I/O), ground or power signals of the semiconductor chip 300, formed thereon. Therefore, the conductive pillar 238a may help to increase the mechanical strength of the bump structure. In one embodiment, the conductive pillar 238a may be formed of copper, so that deformation may be prevented during a subsequent solder re-flow process. A passive device of the semiconductor package, for example, an inductor, a transformer, a routing or an antenna, can be also formed at the same level with the conductive pillar 238a. In one embodiment, the passive device 238b may be thick (defined by the dry film photoresist 234) and have a robust structure, especially for forming an inductor.

Figure 7:
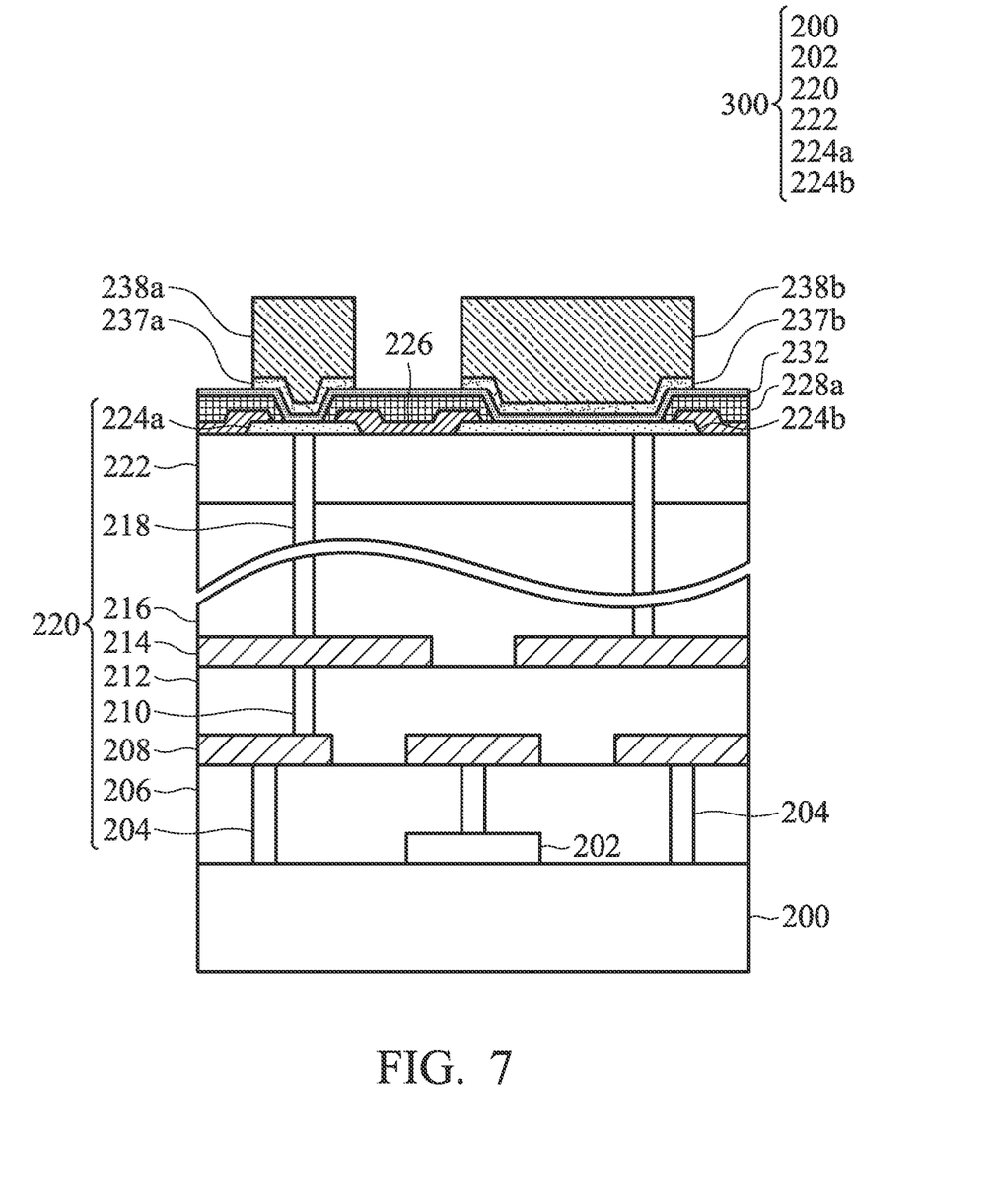

Next, referring to FIG. 7, the dry film photoresist 234 is removed by a stripping process such as a wet etching process using a suitable etchant. After the stripping process, the UBM layer 232 not covered by the conductive pillar 238a and the passive device 238b is exposed.

Figure 8:
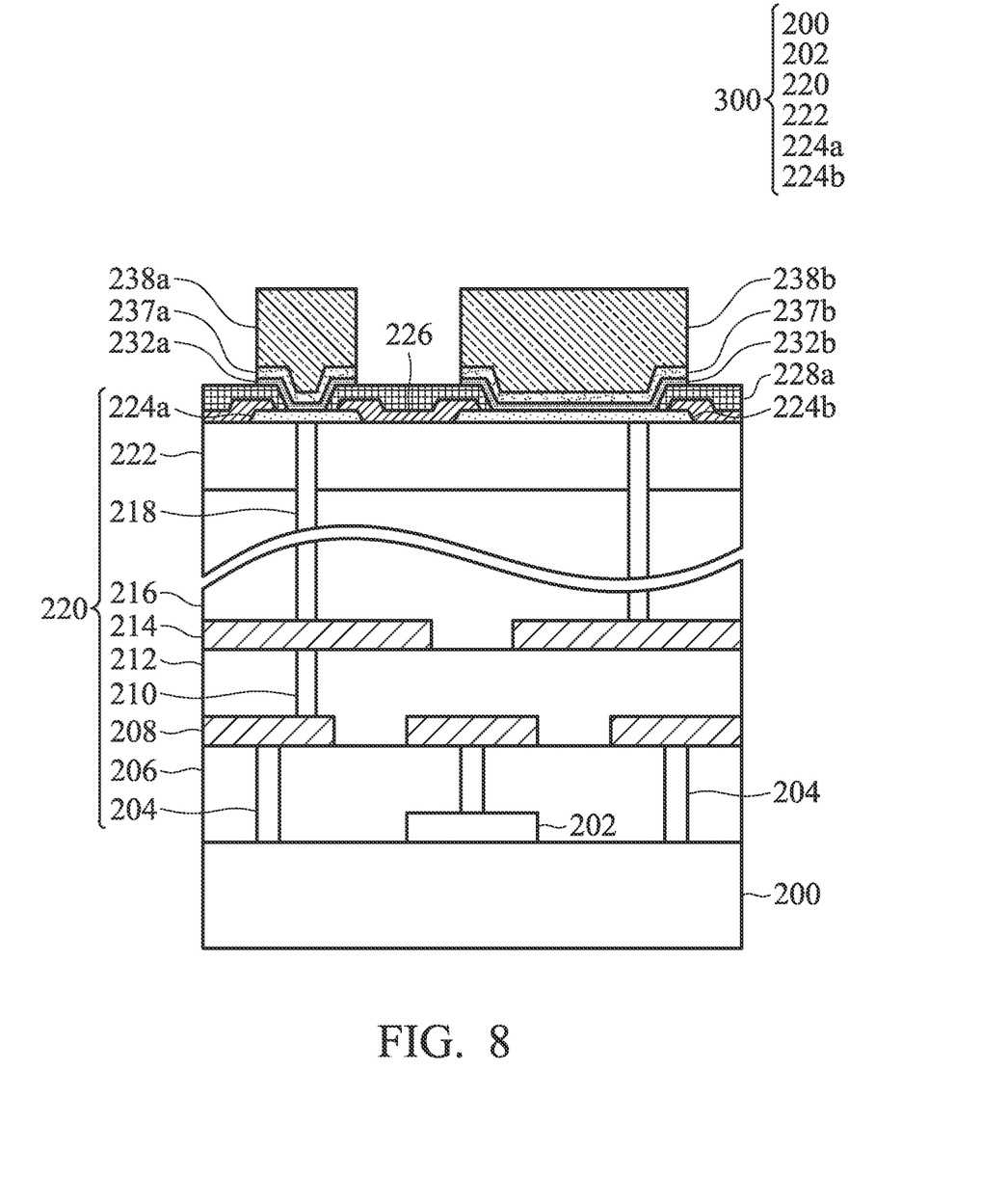

Next, referring to FIG. 8, an anisotropic etching process is performed to remove the UBM layer 232 not covered by the conductive pillar 238a and the passive device 238b, thereby forming UBM layer patterns 232a and 232b under the conductive pillar 238a and the passive device 238b, respectively. After performing the process as shown in FIG. 8, the passive device 238b of the semiconductor package is completely formed, wherein the UBM layer pattern 232b fully overlaps with the passive device 238b. It is noted that the metal pad 224b is only used to transmit power signals to the passive device 238b formed thereon, so that the metal pad 224b partially, but not fully overlaps with the passive device 238b.

Figure 9:
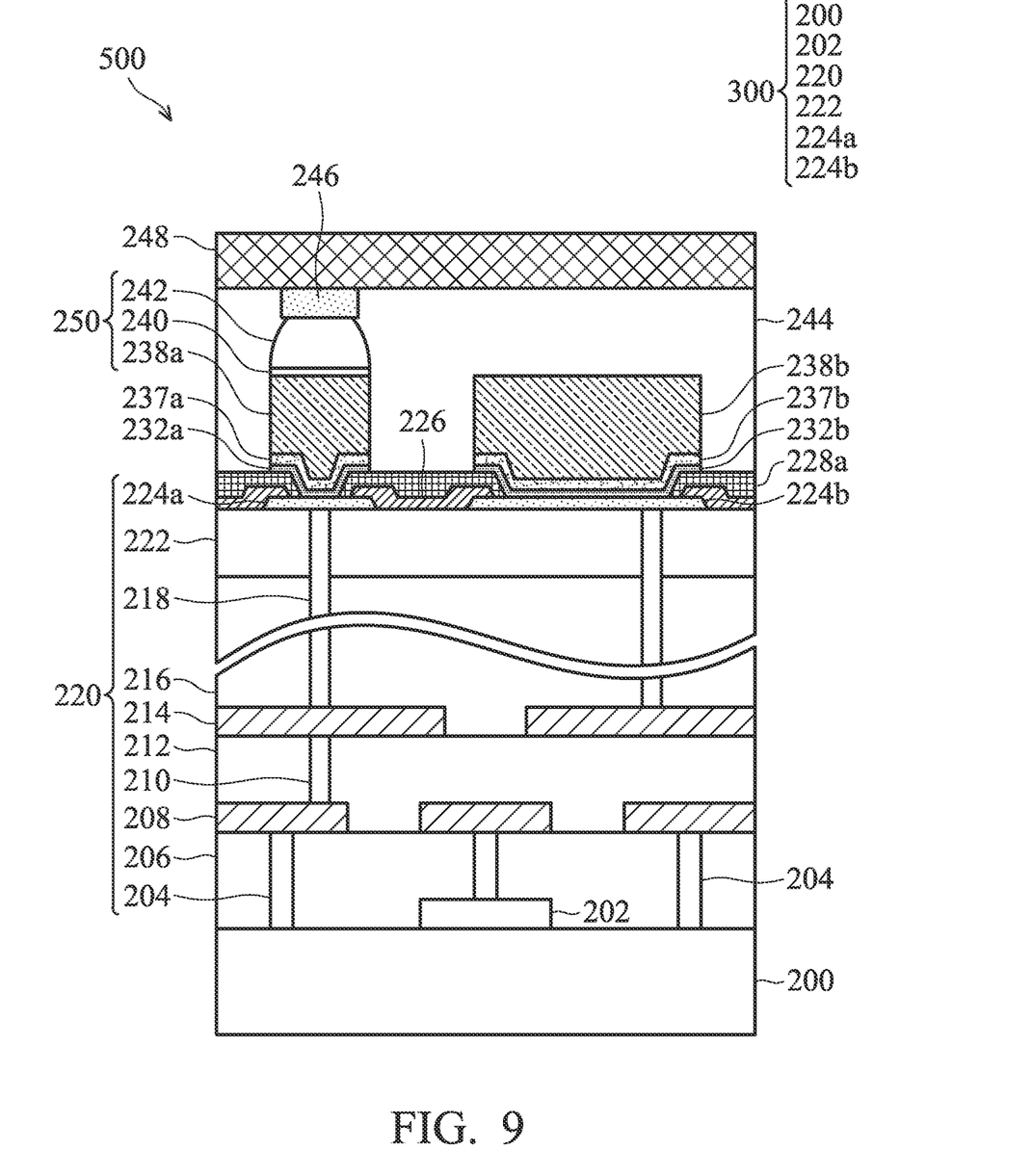

Next, referring to FIG. 9, a conductive buffer layer 240 is formed on the conductive pillar 238a by an electroplating method. In one embodiment, the conductive buffer layer 240 is an optional element serving as a seed layer, an adhesion layer and a barrier layer for a subsequent conductive bump formed thereon. In one embodiment, the conductive buffer layer 240 may comprise Ni.

Next, a solder is formed on the conductive buffer layer 240 by electroplating with a patterned photoresist layer or by a screen printing process. Next, the patterned photoresist layer is removed and a solder re-flow process is performed to form a conductive bump 242 on the conductive pillar 238a. In one embodiment of the invention, the conductive bump 242 is used to transmit input/output (I/O), ground or power signals of the semiconductor device 202. In one embodiment of the invention, the conductive pillar 238a, the overlying conductive bump 242 and the conductive buffer layer 240 (optional) therebetween, collectively form a bump structure 250. Alternatively, a conductive buffer layer or the solder may be additional formed on the passive device 238b, wherein the conductive bump and the solder are at the same level. After the aforementioned processes, one exemplary embodiment of a semiconductor package 500 is completely formed.

Additionally, the semiconductor package 500 can bond to a print circuit board 248 as shown in FIG. 9. In one embodiment, an underfill material 244 may optionally fill a space between the semiconductor package 500 and the print circuit board 248. It is noted that the conductive bump 242 of the semiconductor package 500 bonds to a metal pad 246 of a print circuit board 248 disposed over the conductive bump 242 and the passive device of the semiconductor package 500.

Figure 10:
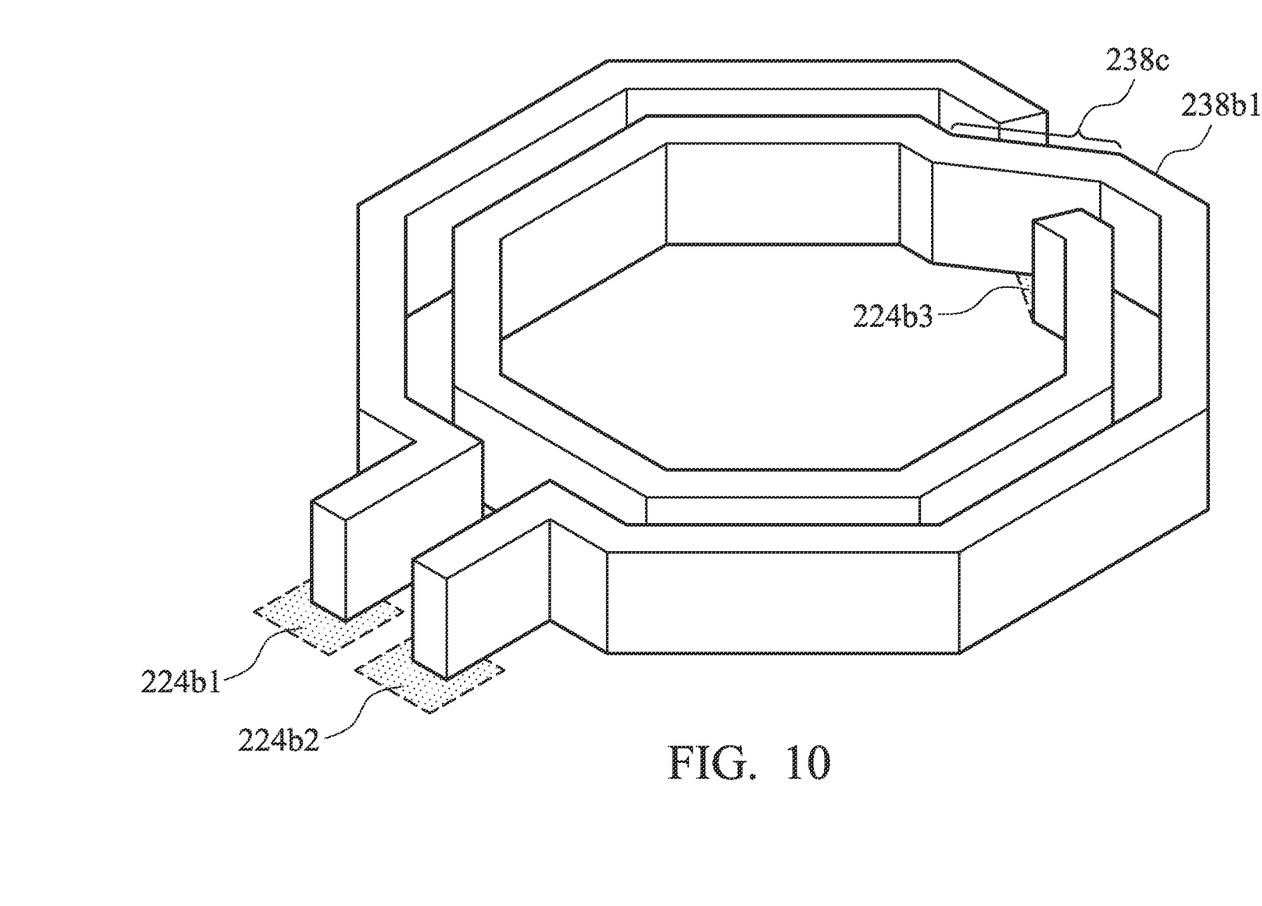
FIG. 10 is a perspective view of one exemplary embodiment of a passive device of a semiconductor package of the invention.

One exemplary embodiment of a semiconductor package 500 provides a passive device 238b disposed at the same level with the bump structure 250 between the conductive pad 224b of the semiconductor package 500 and the metal pad 246 of a print circuit board 248. As shown in FIG. 9, the passive device 238b, for example, an inductor, has two terminals, wherein each of the two terminals may connect to the metal pad of the semiconductor package 500 or the metal pad of a print circuit board 248. In one embodiment, the two terminals of the passive device 238b may respectively connect to two different metal pads (for example as shown in FIG. 10, two terminals of the passive device 238b1 respectively connect to two different metal pads 224b1 and 224b2) disposed on the top of the interconnection structure 220 of the semiconductor package 500. In another embodiment, one terminal of the passive device 238b may connect to the metal pad 224b disposed on the top of the interconnection structure 220 of the semiconductor package 500 and the other terminal of the passive device 238b may connect to a metal pad (not shown) of the print circuit board 248 disposed over the passive device 238b. In yet another embodiment, the two terminals of the passive device 238b may respectively connect to different metal pads (not shown) of a print circuit board disposed over the passive device.

FIG. 10 is a perspective view of one exemplary embodiment of a passive device 238b1 of a semiconductor package of the invention. In one embodiment as shown in FIG. 10, if the passive device 238b1 is an inductor, the two terminals of the passive device 238b1 respectively connect to two different metal pads 224b1 and 224b2 disposed on the top of the interconnection structure of the semiconductor package, for example. If the passive device 238b1, for example, an inductor, has a plurality of turns arranged at the same level, the passive device 238b1 may comprise a connecting segment 224b3 crossing with a portion 238c of the passive device 238b1 but not directly connected to the portion 238c. In one embodiment, the connecting segment 224b3 may be formed by an uppermost metal layer (at the same level with the metal pads 224b1 and 224b2 of the metal layers of the interconnection structure) to avoid shorts.

TABLE 1

Electrical performance comparison results between the conventional on-chip inductor and one exemplary embodiment of a passive device of the invention.

| 4 GHz VCO (voltage controlled oscillator) | | | | | | |
|---|---|---|---|---|---|---|
| | L (nH)@4 GHz | Q@4 GHz | Qpeak | Frequency @ Qpeak | Rout/W/S/N | Area (μm × μm) |
| conventional on-chip inductor | 2.146 | 21.81 | 22.75 | 5.0 | 180/25/3/2 | 360 × 410 |
| passive device of a semiconductor package 500 | 2.187 | 49.69 | 50.15 | 4.5 | 220/20/20/2 | 440 × 490 |

| 6.6 GHz VCO (voltage controlled oscillator) | | | | | | |
|---|---|---|---|---|---|---|
| | L (nH)@6.6 GHz | Q@6.6 GHz | Qpeak | Frequency @ Qpeak | Rout/W/S/N | Area (μm × μm) |
| conventional on-chip inductor | 1.029 | 19.5 | 22.25 | 9 | 110/20/3/2 | 220 × 250 |
| passive device of a semiconductor package 500 | 0.955 | 43.3 | 47.77 | 8.4 | 180/20/20/2 | 360 × 410 |

| 8 GHz VCO (voltage controlled oscillator) | | | | | | |
|---|---|---|---|---|---|---|
| | L (nH)@8 GHz | Q@8 GHz | Qpeak | Frequency @ Qpeak | Rout/W/S/N | Area (μm × μm) |
| conventional on-chip inductor | 0.514 | 27.27 | 27.85 | 9.5 | 150/30/3/1 | 300 × 455 |
| passive device of a semiconductor package 500 | 0.498 | 72.00 | 72.40 | 8.4 | 180/30/20/1 | 360 × 410 |

Table 1 shows electrical performance comparison results between the conventional on-chip inductor and one exemplary embodiment of an inductor of the invention ("package inductor" for short hereinafter). The conventional on-chip inductor is designed at a level of a metal pad (the uppermost metal layer) of an interconnection structure of a semiconductor package. The package inductor is designed at a level between a metal pad and a conductive bump of a semiconductor package. A thickness of the package inductor (about 30 μm) is much thicker than that of the conventional on-chip inductor (about 2.8 μm). The quality factor (Q factor) ($Q = \omega L / R$, where L is inductance, R is resistance, and $\omega$ is the angular velocity in radians per second) of the package inductor is increased because resistance of the passive device is decreased. As shown in Table 1, when the conventional on-chip inductor and the package inductor are used for 4 GHz, 6.6 GHz and 8 GHz VCOs (voltage controlled oscillator), the package inductor dramatically improves performance of the Q factor (>40) over the conventional on-chip inductor.

One exemplary embodiment of a passive device of a semiconductor package 500 has the following advantages. The passive device may be formed at the same level with the conductive pillar, which is disposed between a metal pad and a conductive bump, of the bump structure without additional metal layers. Thus, fabrication costs can be reduced. The passive device may have a thickness that is much thicker than a conventional passive device disposed in the interconnection structure. If the passive device is an inductor, the passive device has reduced resistance and a high quality factor (Q factor). Additionally, the passive device may be formed of copper, so that deformation may be prevented during a subsequent solder re-flow process. Moreover, a layer level of the passive device may have a wider design rule because an area of the passive device is not limited by arrangements of the metal layers and vias of the interconnection structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A semiconductor package, comprising:
  a substrate;
  a first passivation layer disposed on the substrate;
  an under bump metallurgy layer disposed on the first passivation layer;
  a passive device disposed on the under bump metallurgy layer;

an additional under bump metallurgy layer disposed on the first passivation layer, isolated from the under bump metallurgy layer; and a conductive pillar disposed on the additional under bump metallurgy layer, wherein the conductive pillar and the passive device are at the same level.

2. The semiconductor package as claimed in claim 1, further comprises a conductive bump disposed on the additional under bump metallurgy layer, wherein the conductive pillar is disposed between the additional under bump metallurgy layer and the conductive bump.

3. The semiconductor package as claimed in claim 1, further comprises an interconnection structure between the substrate and the first passivation layer, wherein the interconnection structure comprises a plurality of metal layers and a plurality of dielectric layers.

4. The semiconductor package as claimed in claim 3, wherein the interconnection structure comprises a metal pad formed by an uppermost metal layer of the metal layers of the interconnection structure.

5. The semiconductor package as claimed in claim 4, wherein the metal pad is exposed from a first opening of the first passivation layer.

6. The semiconductor package as claimed in claim 4, wherein the under bump metallurgy covers the metal pad exposed from the first opening, extending over the first passivation layer.

7. The semiconductor package as claimed in claim 4, further comprises a second passivation layer between the substrate and the metal pad, wherein the second passivation layer is formed by an uppermost dielectric layer of the dielectric layers of the interconnection structure.

8. The semiconductor package as claimed in claim 1, further comprises a solder covering the passive device.

9. The semiconductor package as claimed in claim 4, wherein the passive device has two terminals respectively connected to the metal pad and an additional metal pad disposed on the top of the interconnection structure.

10. The semiconductor package as claimed in claim 1, wherein the passive device is formed of copper.

11. The semiconductor package as claimed in claim 8, wherein the conductive bump and the solder are at the same level.

12. The semiconductor package as claimed in claim 6, further comprises a third passivation layer disposed between the first passivation layer and the under bump metallurgy layer, wherein the third passivation layer has a second opening to expose a portion of the metal pad exposed from the first opening.

13. The semiconductor package as claimed in claim 3, wherein the passive device comprises a connecting segment crossing with a portion of the passive device.

14. The semiconductor package as claimed in claim 1, wherein the under bump metallurgy fully overlaps with the passive device.

15. The semiconductor package as claimed in claim 13, wherein the first and second passivation layers comprise oxide, nitride, oxynitride, and wherein the third passivation layer comprises polyimide.

16. The semiconductor package as claimed in claim 13, wherein the connecting segment is formed by an uppermost metal layer of the metal layers of the interconnection structure.

17. The semiconductor package as claimed in claim 1, wherein the copper pillar comprises an inductor or an antenna.

* * * * *